United States Patent [19]

Hunsperger

[11] 4,238,759

[45] Dec. 9, 1980

[54] MONOLITHIC PELTIER TEMPERATURE CONTROLLED JUNCTION

[75] Inventor: Robert G. Hunsperger, Newark, Del.

[73] Assignee: University of Delaware, Newark, Del.

[21] Appl. No.: 953,006

[22] Filed: Oct. 20, 1978

[51] Int. Cl.³ .................. H01L 23/56; H01L 29/66
[52] U.S. Cl. ........................................ 357/28; 357/87
[58] Field of Search .................................. 357/28, 87

[56] References Cited

U.S. PATENT DOCUMENTS

| 2,846,592 | 8/1958 | Rutz | 357/28 |
|---|---|---|---|
| 2,915,724 | 12/1959 | Fritts | 357/87 |
| 2,941,153 | 6/1960 | Merrill | 357/28 |
| 3,017,522 | 1/1962 | Lubcke | 357/87 |
| 3,460,008 | 8/1969 | Dahlberg | 357/87 |
| 3,495,141 | 2/1970 | Dahlberg | 357/87 |
| 3,502,518 | 3/1970 | Antell | 357/87 |
| 3,504,240 | 3/1970 | Dahlberg | 357/87 |

FOREIGN PATENT DOCUMENTS 953339  3/1964  United Kingdom .................. 357/87

*Primary Examiner*—Andrew J. James

[57] ABSTRACT

A Peltier-cooled p-n junction in a monolithic solid-state electronic device embodying a substrate comprising a Peltier thermal surface layer disposed adjacent the active region of the p-n junction and in close proximity therewith, the Peltier thermal surface layer having an electrical conductor in circuit therewith affording an electrical path for the withdrawal or supply of Peltier effect current incident to the maintenance of the junction at a preselected temperature.

7 Claims, 5 Drawing Figures

MONOLITHIC PELTIER TEMPERATURE CONTROLLED JUNCTION

BACKGROUND OF THE INVENTION

The Peltier cooling effect and metal semiconductor junction Peltier coolers are known in the art and are discussed by A. van der Ziel, *Solid State Physical Electronics*, Prentice Hall (1976) pp. 491–496. However, insofar as is known, no one has proposed a monolithic construction embodying both semiconductor junctions and Peltier coolers.

SUMMARY OF THE INVENTION

Generally this invention comprises means for maintaining the temperature of a p-n junction in a monolithic solid-state electronic device embodying a substrate utilizing a Peltier thermal surface layer disposed adjacent the active region of the p-n junction and in close proximity therewith, the Peltier thermal surface layer being provided with an electrical conductor in circuit therewith through a first terminal affording an electrical path for the withdrawal or supply of Peltier effect current incident to the maintenance of the junction at a preselected temperature.

THE DRAWINGS

This specification incorporates the following drawings:

FIG. 1 is a schematic cross-sectional view taken on line 1—1 of FIG. 1A showing an embodiment of this invention utilized for temperature maintenance in a single p-n lasing junction semiconductor device, FIG. 1A is a plan view of the apparatus shown in FIG. 1 taken on line 1A—1A thereof, FIG. 2 is a schematic cross-sectional view taken on line 2—2, FIG. 2A of a fragmentary double heterostructure, distributed feedback integrated laser of the type utilized in an optical integrated circuit, FIG. 2A is a plan view of the apparatus shown in FIG. 2 taken on line 2A—2A thereof, and FIG. 3 is a schematic switching circuit for an embodiment of this invention employing an auxiliary current source.

DETAILED DESCRIPTION OF THE INVENTION

This invention is hereinafter described with particular application to injection laser structures, because the latter operate with relatively large heat outputs; however, it will be understood that the invention is equally applicable to FETs and IMPATT diodes, Gunn oscillators, LEDs and other devices wherein active region temperature is a parameter affecting operation.

Semiconductor lasers are described by C. H. Gooch in his book *Gallium Arsenide Lasers* published by Wiley Interscience (1969).

Figure 1:
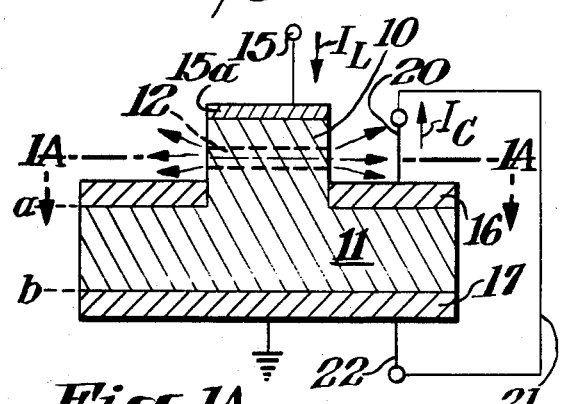
Figure 1A:
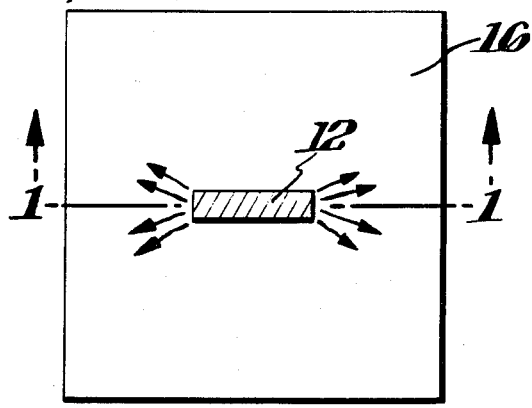

Referring to FIGS. 1 and 1A, the injection laser shown here incorporates a p layer 10 with a carrier concentration of typically $1 \times 10^{17}$/cm$^3$ formed by diffusion or ion implantation doping and measuring 10 microns by 300 microns which abuts substrate 11, which latter constitutes the n layer (typically, $1 \times 10^{17}$/cm$^3$) fabricated from GaAs and measuring 1.5 mm $\times$ 1.5 mm). The active region, which emits the laser radiation in the directions indicated by the wavy arrows, is denoted 12, which is typically less than 5 microns thick, whereas the depth of substrate 11 measured from point a to point b, FIG. 1, is typically 125 microns. The laser current $I_L$ is supplied through terminal 15 and contact 15a, which latter can be, typically, Au or AuGe.

A typical amount of heat liberated by a lasing junction of the design shown in FIGS. 1 and 1A is 0.5 watt when operated in the CW mode at room temperature. It has been found that, in semiconductor lasers, temperature is a limiting factor for line width, wavelength stability, operating lifetime and threshold current. Presently used cooling techniques, including those using Peltier junctions, are inadequate because the cold surface must always be located external of the device, 100 microns or more distant from the lasing junction.

This invention utilizes a Peltier-cooled laser having the cooling junction located within a few microns of the lasing junction active region 12 where the heat is generated. Moreover, the cooling junctions are formed monolithically as part of the lasing device itself.

Thus two Peltier thermal surface layers are incorporated monolithically with the semiconductor device, the topmost, denoted 16, being bonded to the top surface of substrate 11, and the lowermost, denoted 17, being bonded to the basal surface of substrate 11. These Peltier layers are conveniently laid down by vacuum evaporation of silver with individual thicknesses of approximately 5 microns. Other suitable materials for these layers include Au-Ge, Au-Ge-Ni and Au.

Since Peltier thermal surface layer 16 lies closely adjacent active region 12, it quickly takes up heat from region 12 and transduces it to a Peltier effect cooling current $I_c$. A first terminal 20, attached to layer 16, is connected via electrical conductor 21 to a second terminal 22 attached to lowermost Peltier thermal layer 17, which latter is grounded. Thus, the heat generated in the lasing process flows to the adjacent Peltier cooling layer 16 and is effectively pumped to the substrate back contact 22 by the Peltier-effect cooling current $I_c$. Peltier cooling layer 17 is heat-sinked in conventional manner, not detailed, thereby voiding heat from the electronic structure.

The specific n and p doping concentrations reported are suitable for both lasing action and Peltier-effect cooling; however, a range of concentrations by a factor of 2 about these values, and possibly even greater, should also be entirely suitable.

The semiconductor GaAs has been selected as the example here because it is a commonly used laser material; however, other suitable semiconductor materials could also be used.

For the geometry of device shown in FIG. 1, the calculated amount of heat pumped is 0.49 watt for a cooling current $I_c = 10.8$ amperes, which closely matches the 0.5 watt typically produced by the laser under conditions of operation hereinbefore reported. Therefore, it should be possible to pump essentially all of the heat generated by a CW laser to the heatsink utilizing a simple two-junction Peltier cooler as described.

It is practicable to achieve a balance between physical size factors and Peltier-cooling effect. For example, in the design of FIGS. 1 and 1A, if the GaAs substrate 11 can be thinned to 25 microns and the thickness of the silver cooling layer 16 increased correspondingly to 100 microns by etching and back-filling techniques, the heat pumped should be approximately one watt for the same 10.8 amperes of cooling current $I_c$.

For best results, it is preferred that the areas of the Peltier thermal surface layers be substantially equal in extent.

Figure 2:
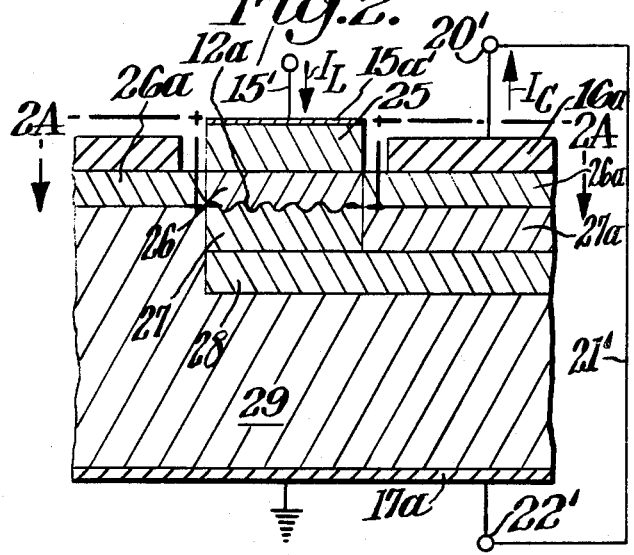
Figure 2A:
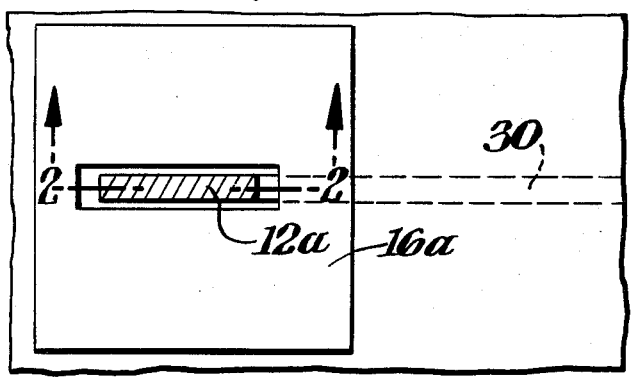

FIGS. 2 and 2A detail a more complex laser structure adapted to temperature control according to my invention. The FIG. 2, 2A design is a double heterostructure, distributed feedback integrated laser such as would be used in an optical integrated circuit, which has monolithically incorporated a Peltier cooling layer of the type hereinbefore described.

The FIG. 2, 2A construction is as follows, all elements being typically 5 microns thick except for substrate 29, which is 135 microns thick in the region underlying in element 26a and 125 microns in the region underlying n element 28:

terminal 15' and contact 15a' supplying the laser current $I_L$—typically Au or AuGe.

p element 25—$2 \times 10^{19}/cm^3$ GaAs
p element 26—$1 \times 10^{17}/cm^3$ $Ga_{0.75}Al_{0.25}$ As
p element 27—$1 \times 10^{16}/cm^3$ GaAs
n element 26a—$1 \times 10^{15}/cm^3$ $Ga_{0.75}Al_{0.25}$ As
n element 27a—$1 \times 10^{16}/cm^3$ $Ga_{0.8}Al_{0.2}$ As
n element 28—$1 \times 10^{17}/cm^3$ $Ga_{0.75}Al_{0.25}$ As
n element 29 (substrate)—$2 \times 10^{18}/cm^3$ GaAs
topmost Ag Peltier thermal layer 16a, typically 5 microns thick and 1.5 mm on a side
basal Ag Peltier thermal layer 17a, typically 5 microns thick and 1.5 mm on a side Again, referring to FIG. 2A, the light-emitting distributed feedback laser, or active region 12a, measures 10 microns wide by 300 microns long, being coupled to a waveguide 30 for laser radiation delivery.

Terminal 20' and conductor 21' connecting with lower terminal 22' permit the flow of Peltier current $I_c$ to basal Peltier thermal layer 17a, which is grounded and heat-sinked as hereinbefore described for the embodiment of FIGS. 1 and 1A.

Figure 3:
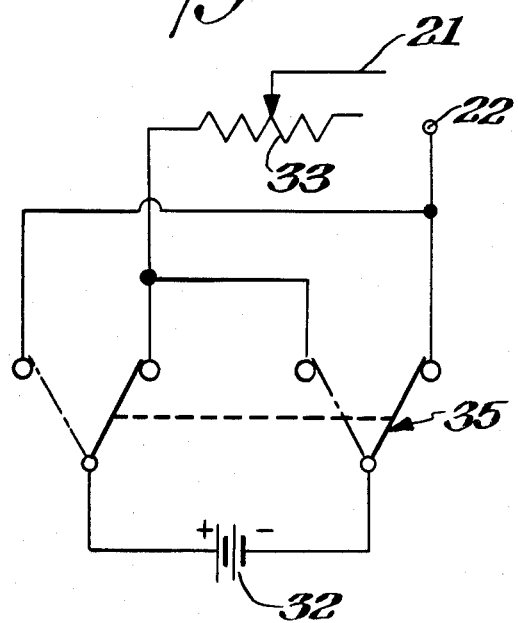

The foregoing embodiments are directed to cooling electronic devices; however, if the direction of the $I_c$ current is reversed, heating of the topmost thermal layers 16 or 16a occurs due to the same Peltier effect. Thus, as shown in FIG. 3, a source of d-c current 32 (typically 1–10V, approximately 9 amp) interposed in series with conductors 21 or 21', and terminal 22 provided with a manually adjustable variable resistor 33 and a two pole double throw switch 35 selectively effecting current flow direction to be reversed affords means for regulating the temperature of a semiconductor device by either heating or cooling, as desired. This combination of heating and cooling of the lasing junction by control of $I_c$ can be used to tune the wavelength of a laser (or light-emitting diode) over a considerable range in a controllable manner. For example, in a GaAs LED or laser the wavelength of the emitted light varies by 3A/° C. Thus, a monolithic Peltier junction of the design described can be used either to stabilize the emitted wavelength against temperature variation or to deliberately tune the wavelength by temperature variation.

It will be understood that maximum cooling is achieved with an auxiliary d-c source 32, since, without this source, the cooling current is limited to about one ampere magnitude. Moreover, cooling is a non-linear function of current $I_c$.

Finally, it has been found that a relatively thick plate 16, e.g., one 5 microns thick, contributes substantially to the cooling obtained by increasing the area over which thermal conduction occurs.

I claim:

1. Means for maintaining the temperature of a p-n junction in a monolithic solid-state electronic device embodying a substrate comprising a Peltier thermal surface layer disposed adjacent the active region of said p-n junction and in close proximity therewith, said Peltier thermal surface layer being provided with an electrical conductor in circuit therewith through a first terminal affording an electrical path for the withdrawal or supply of Peltier effect current incident to the maintenance of said junction at a preselected temperature.

2. Apparatus according to claim 1 wherein a current source is interposed in circuit with said conductor via a switch effecting optional selective supply and direction of current flow through said monolithic solid-state electronic device.

3. Apparatus according to claim 1 utilized for cooling a p-n junction in a solid state electronic device wherein said Peltier thermal surface layer is employed for cooling said p-n junction by connection with a second Peltier thermal surface layer attached to said substrate.

4. Apparatus according to claim 3 wherein said p-n junction is of the lasing type.

5. Apparatus according to claim 1 wherein said Peltier thermal surface layer is one of the group consisting of Ag, Au-Ge, Au-Ge-Ni, and Au.

6. apparatus according to claim 3 wherein said Peltier thermal surface layers are substantially equal in area.

7. Apparatus according to claim 3 wherein said Peltier thermal surface layer is at least 5 microns thick.

* * * * *